United States Patent [19]

Lam

[11] Patent Number: 4,686,394
[45] Date of Patent: Aug. 11, 1987

[54] ECL CIRCUIT WITH CURRENT-SPLITTING NETWORK

[75] Inventor: Nim C. Lam, Sunnyvale, Calif.

[73] Assignee: Fairchild Semiconductor, Cupertino, Calif.

[21] Appl. No.: 832,796

[22] Filed: Feb. 25, 1986

[51] Int. Cl.$^4$ .......................................... H03K 19/086
[52] U.S. Cl. .................... 307/455; 307/443; 307/454; 307/272 A; 307/291
[58] Field of Search ............. 307/443, 446, 454, 455, 307/551, 565, 272 R, 272 A, 291

[56] References Cited

U.S. PATENT DOCUMENTS

| | | | |
|---|---|---|---|
| 3,446,989 | 5/1969 | Allen et al. | 307/454 |
| 3,649,844 | 3/1972 | Kroos | 307/455 X |
| 3,760,190 | 9/1973 | Hannaford | 307/272 R |
| 3,917,961 | 11/1975 | Reed | 307/455 X |
| 4,215,418 | 7/1980 | Muramatsu | 307/455 X |
| 4,359,647 | 11/1982 | Trinkl | 307/291 X |
| 4,580,066 | 4/1986 | Berndt | 307/455 X |

Primary Examiner—Stanley D. Miller
Assistant Examiner—D. R. Hudspeth
Attorney, Agent, or Firm—Clifton L. Anderson

[57] ABSTRACT

A two-level series gating complementary output master-slave D-type flip-flop (100) with multiplexed input incorporates a novel current-splitting network (108). The flip-flop includes a master latch (102), a slave latch (104) and a 2:1 multiplexer (106) incorporated into the master latch. The multiplexer includes a pair of matched, emitter-coupled, collector-uncoupled transistors (Q12 and Q13), the bases of which are tied to a reference voltage (VBB2). When a clock pulse (CP) is low, substantial network current flows through both matched transistors. This arrangement allows the circuit function to be implemented with a reduced transistor count and only two current sources. The master latch output (QM) is determined by the voltage at the base of an output transistor (Q21), which voltage is determined by the presence or absence of a current through a load resistor (RL1). When the clock (CP) is high, the master latch output (QM) is fed back through control of a feedback transistor (Q23) and transferred to the slave latch through control of an input transistor (Q29). The currents through load resistors (RL2 and RL3) in the slave latch control the complementary outputs (QS) and (QS*) by setting the voltages at the bases of two output transistors (Q33 and Q35).

14 Claims, 1 Drawing Figure

ECL CIRCUIT WITH CURRENT-SPLITTING NETWORK

BACKGROUND OF THE INVENTION

The present invention relates to electrical circuits, and, more particularly, to an emitter-coupled logic circuit applicable to gate array design.

Gate arrays are semiconductor devices with standard doping layers and customizable metalization layers. Gate arrays allow a design effort to obtain application specific integrated circuits while avoiding the long lead times involved in designing a circuit from scratch. Since they are neither off-the-shelf items, nor entirely customized, gate arrays are considered semi-custom devices. Gate arrays can be fabricated according to a variety of process technologies, for example, complementary metal-on-oxide (CMOS) and bipolar emitter-coupled logic (ECL).

To facilitate the customizing of a gate array, the gate array is divided into a number of transistor groupings or "cells". A cell library is often made available which defines macros, each of which corresponds to a logic function or combination of functions which can be implemented in a predetermined number of cells or fractions thereof. In some gate array designs, a given function may be implemented many times. Thus, given the competitive condition of the gate array industry, it is a commercial necessity to implement each logic function as efficiently as possible to maximize the functionality of the completed gate array design. To a first approximation, efficient implementation means minimizing transistor count and the number of current sources for a given number of gating levels.

When high speeds are required, ECL is often the process of choice. Rather than switching current on and off, ECL circuits redirect a constant magnitude network current through alternate paths. Transistors in an ECL circuit remain in their linear operating regions and, accordingly, are not subject to the delays involved in switching in and out of saturation.

A typical ECL circuit includes a voltage source, a current network and a gating system. The voltage source is generally considered as separate high (VCC) and low (VEE) sources. The voltage source applies a potential difference across the network so as to generate a current through one, or sometimes more, of the paths that constitute the network. The gating system determines the path or paths through which the network current flows at any given time.

An elementary gate includes a "switching" transistor and a "reference" transistor, which are characterized by the voltages applied to their bases. The voltage applied to the base of a "reference" transistor is a constant reference voltage (VBB), usually between VCC and VEE. The voltage applied to the base of a "switching" transistor is usually discretely variable between a voltage above VBB and a voltage below VBB.

The elementary gate's switching and reference transistors have their emitters coupled, hence the designation "emitter-coupled logic", and their collectors uncoupled. "Coupled" implies the existence of a conductive path between coupled elements. Whether a conductive path is coupling depends on the operational significance of any voltage drops along the path. If current through the path undergoes a voltage drop comparable to, e.g. is one third or more of, that which the same current would undergo through a transistor, there is no coupling, and the elements electrically connected by the path are "uncoupled", as the term is used herein. If the resistance is such that the voltage drop caused by an operational current is substantially less than, e.g. less than one tenth, that the same current would undergo through a transistor, then elements connected by the path are considered "coupled".

The operation of this elementary gate in the context of a circuit with a voltage applied across the gate is straightforward. When the voltage at the base of the switching transistor is below the reference voltage VBB, current flows from the high voltage source, through the reference transistor via its respective load resistor and eventually to the low voltage source. Alternatively, when the voltage applied to the base of the switching transistor is higher than the reference voltage VBB, current flows through the switching transistor. Thus, the gating system, by controlling the voltage at the base of the switching transistor determines the path of the current through the gate.

Where a load resistance is placed in series between the high voltage source and the collector of the reference transistor, a low voltage at the base of the switching transistor causes a voltage drop across the load resistor; no such drop occurs when the voltage at the base of the switching transistor is high. Accordingly, the voltage at the base of the switching transistor can control an output driven by the voltage between the load resistor and the collector of the reference transistor. Analogous effects can be achieved by incorporating a load resistor between the high voltage source and the collector of the switching transistor.

A common approach to elaborating upon the elementary gate is to place a second switching transistor in parallel with the first to produce an OR gate. In such an OR gate, the voltages at the bases of the switching transistors are the inputs, while the output is provided by a voltage between a load resistor and the collector of the reference transistor, or the coupled collectors of the parallel switching transistors.

Such gates are incorporated into current networks. Typically, each current is characterized by an electron current source transistor through which substantially all of the network current flows. Networks can be characterized according to the number of gating levels involved. A one-level series gating network might include the OR gate described above with the gate emitters coupled to the collector of the source transistor. In a two-level series gating network, the sources of current at the collectors of the reference transistor and the switching transistors would be determined by another set of gates electrically between the OR gate and the high-voltage source. Higher level series gating structures can be generated by extension.

Multi-level series gating networks include subnetworks as well as current paths. A subnetwork is constituted by a set of one or more network current paths which share a transistor which defines the subnetwork. The "subnetwork" transistor of a given network is defined to be the common transistor at the lowest voltage level in the constituting paths other than the network current source transistor and the defining transistors of any subnetworks which include the given network. Subnetworks on the same level are mutually exclusive in the sense that a given path must belong to one and only one subnetwork on a given level.

Conventionally, network current flows through only one network path, in other words, through one series of transistors, at a time. An exception is illustrated by the OR gate, since when both inputs are on, substantial current can flow through both switching transistors, if their specifications are relatively close. The division of the current between the switching transistors is not operationally significant, since if the current only passes through one of the switching transistors, the effect on the output is the same.

The ECL gate array industry, like many others, has developed certain design principles which are intended to facilitate the design of logic functions. However, such design principles can serve to exclude approaches which in some cases can yield more optimal results. As described hereinbelow, some common design assumptions are eschewed to implement certain logic functions more efficiently.

SUMMARY OF IHE INVENTION

An emitter-coupled logic circuit includes a voltage source, a gating system and a multi-level current network with subnetworks. The gating system providing for the splitting of network current between at least two same-level subnetworks. This current-splitting can be accomplished by arranging the defining transistors of these subnetworks to be nonparallel, emitter-coupled and matched. The transistors should be matched at least with respect to steady state (DC) characteristics, and preferably, with respect to transient (AC) characteristics so that current-splitting is predictable during switching as well as between switchings.

Such a circuit can be provided in which current constantly flows through both subnetworks. Alternatively, means can be provided for preventing current flow through one or both of the subnetworks. These alternatives can be provided by including a third subnetwork which can be used to bypass one or both of the matched transistors. Another approach to preventing flow through one of the subnetworks is to provide means for forcing the entire network current through the one or more other matched transistors. Embodiments are provided in which the current is split in three or more substantial portions.

The present invention provides for novel and advantageous logic circuits. In one of its realizations, the present invention provides for a two-to-one multiplexer with latch requiring only one current source. By adding two more transistors, a latch with an integrated 2:1 multiplexer is provided. Master-slave flip-flops with integral multiplexers are provided with reduced transistor count and a minimal number of current sources. Those skilled in the art can readily extend the basic invention herein beyond the circuits detailed below.

DETAILED DESCRIPTION OF IHE PREFERRED EMBODIMENTS

Figure 1:
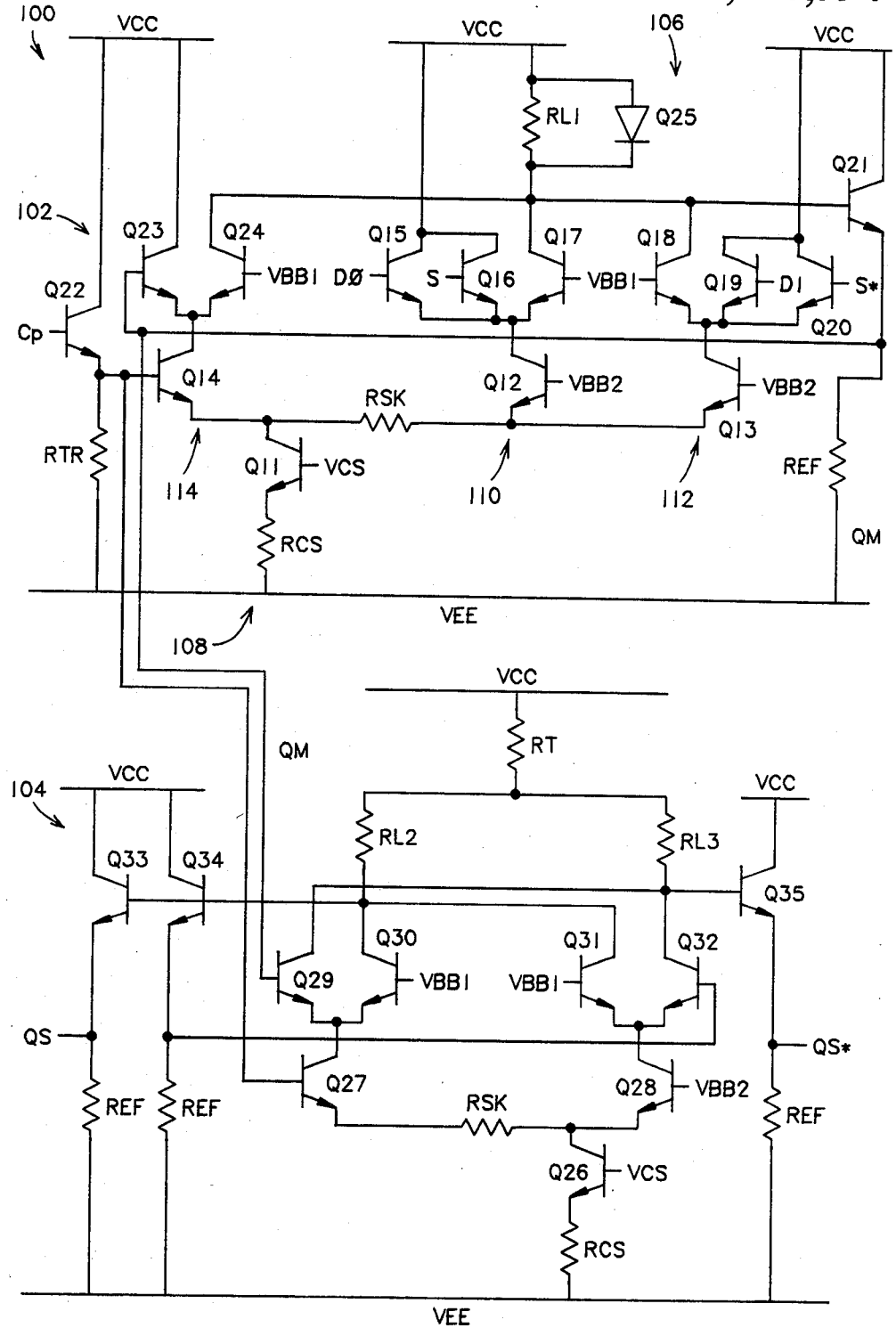
FIG. 1 is a schematic of a D-type master-slave flip-flop with multiplexed input in accordance with the present invention.

The present invention provides for a complementary output master-slave D-type flip-flop 100 with a multiplexed input having a master latch 102 and a slave latch 104. A 2:1 multiplexer 106 is integrated into the master latch 102. The master latch includes a current source network 108 defined by current source transistor Q11.

The current source network 108 includes first, second and third subnetworks, 110, 112 and 114 respectively.

In accordance with the present invention, the flip-flop has a distributed gating system, which is illustrated but not localized for reference purposes. The gating system, includes means for splitting the current through network 108 between subnetworks 110 and 112. This is accomplished through the action of matched subnetwork transistors Q12 and Q13. These subnetwork transistors share a common reference voltage VBB2 at their bases. The common base voltage and common specifications provide a roughly 50:50 current split between the incorporating subnetworks.

The subnetwork reference transistors are emitter-coupled to a third subnetwork transistor Q14. This is a switching transistor in that means are providing for establishing a base voltage at Q14 either above or below VBB2. When that voltage is below VBB2, the reference subnetwork transistors Q12 and Q13 are both on and the network current flows through them. When the voltage at the base of Q14 is high, substantially all network current passes through the third subnetwork 114.

The advantages of the illustrated embodiment are more apparent as the operation of the master latch 102 and, in particular, the multiplexer section 106 are described in greater detail below. Multiplexer subnetwork 110 includes current paths defined by transistors Q15, Q16 and Q17, while multiplexer subnetwork 112 includes current paths defined by transistors Q18, Q19 and Q20. The third subnetwork 114 includes current paths defined by transistors Q23 and Q24.

Focusing on current subnetwork 110, the current path defined by transistor Q15 begins at VCC, includes the path-defining transistor Q15, the subnetwork-defining transistor Q12, a very small flip-flop skew resistance RSK, current source transistor Q11, and a current source resistance RCS, and ends at VEE. The path through Q16 is the same, except, of course, the path-defining transistor is different. The path defined by transistor Q17 is basically similar, except that it includes a load resistor RL1 between VCC and the collector of Q17. Thus, when current flows through Q17, there is a voltage drop detectable between the load resistor and the collector for Q17.

Q17 differs from the other two path defining transistors Q15 and Q16 in its subnetwork in that its base is tied to a reference voltage VBB1. Q15 and Q16 are switching transistors in that their bases are tied to variable voltages The line D0 to Q15 is intended to function as a data input line, while the line S to Q16 is intended to operate as a select line.

Subnetwork 112 is structurally analogous to subnetwork 110. In this case, Q18 is the path-defining reference transistor, Q19 is the input for a second data line D1, and Q20 is the input for S*, the complement of the input S to Q16. In either subnetwork 110 or 112, any current through a path-defining reference transistor Q17, Q18 flows through the load resistor RL1, whereas current through switching transistors Q15, Q16, Q19 and Q20 does not.

The foregoing structure provides a multiplexing function as follows. When S=0 (logic and voltage low), S* =1 so that Q20 is on and none of the current through subnetwork 112 is pulled through the load resistor RL1. Since S is low, Q16 is off, and D0 determines the path of the current through subnetwork 110. When D0=1, all the network current bypasses the load resistor RL1, and the voltage at the base of output transistor Q21 is high.

When D0=0, the current through subnetwork 110 flows through reference transistor Q17 and thus the load resistor RL1. This causes a voltage drop across the load resistor RL1 and a voltage low at the base of Q21. Hence, when S=0, D0 determines the output voltage.

When S=1, all current through subnetwork 110 bypasses the load resistor RL1. The transistor Q20 controlled by S* is off, so the current path is determined by D1. When D1 is high, current bypasses RL1 and the output is high. When D1 is low, the current through subnetwork 112 flows through reference transistor Q18 and hence through the load resistor RL1. The resulting voltage drop yields a logic low at the base of transistor Q21. Thus, the status of the select signal S determines which input D0 or D1 is reflected at an output, effecting the multiplexer function.

The multiplexed input having been described, the remainder of the master latch 102 makes use of the third subnetwork 114. The voltage state of the clock pulse CP determines the voltage at Q22 and hence Q14. While CP is high, Q14 is on, and no current flows through subnetworks 110 and 112. The network current path is thus defined by Q23 or Q24 depending on the voltage at the base of Q23.

The voltage at the base of feedback transistor Q23 is the output QM of the master latch 102, which is determined by the voltage at the base of Q21. When CP=QM=1, current flows through transistor Q23, bypassing the load resistor RL1 so that QM remains high. When CP=1 and QM=0, current flows through reference transistor Q24 and thus through the load resistor RL1, maintaining QM at a logic low. Thus, the master latch 102 includes the standard feedback loop which functions when CP=1. When CP is low, the multiplexed input determines the status of QM, thus a D-type latch function is implemented.

It should be noted that when Q14 and Q24 are on, the entire network current flows through the load resistor RL1. This is about twice the maximum current that flows through a path connected to RL1 when CP is low and a fraction of the network current flows through each of the multiplexer subnetworks 110 and 112. Therefore, a diode Q25, in the form of a transistor with the base and collector connected, is placed in parallel to RL1 to prevent the voltage at the base of Q21 from falling below operating range.

The slave latch 104 includes a current source transistor Q26 defining a current source network having two subnetworks defined respectively by switching transistor Q27, and reference transistor Q28, the base of which is tied to a reference voltage source VBB2. The subnetwork defined by Q27 includes paths defined respectively by switching transistor Q29 and reference transistor Q30, the base of which is tied to reference voltage VBB1. The subnetwork defined by Q28 includes paths defined respectively by reference transistor Q31, the base of which is tied to VBB1, and switching transistor Q32.

In the slave latch 104, current flows though Q27 when CP=1 and Q28 when CP=0. Thus, when CP=1, QM, the voltage at the base of Q29, controls the current flow. When CP=QM=1, the resulting current drop through RL3 shuts Q35 off and drives QS* low while its complement QS is high due to the relatively high voltage at the bases of transistors Q33 and Q34. Likewise, when CP=1 and QM=0, current flows through Q30 and hence through RL2 so that QS is low while QS* is high. Thus, when the clock pulse CP is high, QS=QM.

When the clock pulse CP is low, Q28 defines the subnetwork to carry the slave latch network current. Thus, QM does not affect the output QS when CP is low. When QS is high, Q32 is on, causing a voltage drop across RL3 but not RL2, so QS remains high and QS* remains low. When QS is low, current flows through Q31 and thus through RL2 and not through RL3 so that QS remains low and QS* remains high. Thus, a conventional slave latch function is implemented.

As indicated above, the steady state (DC) parameters of the current splitting transistors Q12 and Q13 should be matched. This permits an even division of current between the two subnetworks. Preferably, the transient or AC characteristics are well-matched as well so that the subnetworks respond similarly during switching.

In the illustrated embodiment, current through RL1 causes a voltage drop equal to the drop caused by current through RL2 or RL3. This is effected by making RL1 with twice the resistance of the other load resistors. Alternatively, the circuit can be designed so that the network current in the master latch 102 is twice the network current in the slave latch 104. Those skilled in the art can recognize a continuum of intermediate solutions. The remaining circuit components are conventional resistors: a level-shifting resistor RT, a level translating resistor RTR, four emitter-follow resistors REF, current source resistors RCS and flip-flop skew resistors RSK.

As is evident from the foregoing, an ECL master-slave D-type flip-flop with multiplexed input and complementary outputs QS and QS* has been provided using only two current source networks and 25 transistors. Furthermore, transistor Q32 could be eliminated if QS* were not required, so the transistor count could be only 24. In addition to the incorporating flip-flop, the foregoing discloses embodiments of a 2:1 multiplexer and a simple D-type flip-flop with a multiplexed input.

The foregoing is representative of a broad range of embodiments provided by the present invention. One could readily rework the flip-flops to produce only one output, or to add a set or reset function. In addition, the current-splitting structure has application beyond flip-flops, latches and simple multiplexers. Accordingly, the scope of the present invention is limited only by the following claims.

What is claimed is:

1. An ECL circuit comprising:
voltage means for providing multiple voltage levels, said voltage means including high source voltage means for supplying a relatively high source voltage, low source voltage means for supplying a relatively low source voltage, high reference voltage means for providing a high reference voltage between said high source voltage and said low source voltage, and low reference voltage means for supplying a low reference voltage between said high reference voltage means and said low source voltage;

first transistor means including a first transistor, said first transistor having its emitter coupled to said low source voltage means, said first transistor means including means for supplying a voltage to the base of said first transistor so as to maintain a substantially constant current therethrough;

second transistor means including a second transistor with its emitter coupled to the collector of said first transistor;

third transistor means including a third transistor with its emitter coupled to the collector of said first transistor;

fourth transistor means including a fourth transistor with its emitter coupled to the collector of said first transistor;

first gating means for turning on said fourth transistor while turning off said second and third transistors andfor turning off said fourth transistor while turning on said second and third transistors, said first gating means including means for receiving a first binary signal characterized at different times by voltages above and below said low reference voltage, said first gating means being coupled to apply said first binary signal to the base of at least one of said third and fourth transistors and to coupled said low reference voltage to the base of the other of said third and fourth transistors, said first gating means being arranged to provide the same voltage to the base of said second transistor as is applied to the base of said third transistor;

fifth transistor means including a fifth transistor with its emitter coupled to the collector of said second transistor;

sixth transistor means including a sixth transistor with its emitter coupled to the collector of said second transistor, said sixth transistor having its base coupled to said high reference source voltage;

second gating means for supplying a second binary signal to the base of said fifth transistor, said second binary signal being characterized at different times by a voltage above said high reference voltage and a voltage below said high reference voltage so that when said second binary signal's voltage is above said high reference voltage said sixth transistor is off and when said second binary signal's voltage is below said high reference voltage said fifth transistor is off;

seventh transistor means including a seventh transistor with its emitter coupled to the collector of said third transistor;

eighth transistor means including an eighth transistor with its emitter coupled to the collector of said third transistor, said eighth transistor having its base coupled to said high reference voltage means;

third gating means for supplying a third binary signal to the base of said seventh transistor, said third binary signal being characterized at different times by a voltage above said high reference voltage and a voltage below said high reference voltage so that when said third binary signal's voltage is above said high reference voltage said eighth transistor is off and when said third binary signal's voltage is below said high reference voltage said seventh transistor is off;

ninth transistor means including a ninth transistor with its emitter coupled to the collector of said fourth transistor;

tenth transistor means including a tenth transistor with its emitter coupled to the collector of said fourth transistor, said tenth transistor having its base coupled to said high reference voltage means;

fourth gating means for supplying a fourth binary signal to the base of said ninth transistor, said fourth binary signal being characterized at different times by a voltage above said high reference voltage and a voltage below said high reference voltage so that when said fourth binary signal's voltage is above said high reference voltage said tenth transistor is off and when said fourth binary signal's voltage is below said high reference voltage said ninth transistor is off;

eleventh transistor means including an eleventh transistor with its collector and its base both coupled to said high source voltage means, the emitter of said eleventh transistor being coupled to the collector of exactly one of said fifth and sixth transistors and to the collector of exactly one of said seventh and eighth transistors and to the collector of exactly one of said ninth and tenth transistors, the collectors of those of said fifth through tenth transistors not coupled to the emitter of said eleventh transistor being coupled directly to said high source voltage means, said eleventh transistor means including a first lead resistor coupled in parallel with said eleventh transistor so that when substantially all current flowing through said first transistor is flowing through said eleventh transistor means the voltage drop across said eleventh transistor is substantially equal to the voltage drop across said first load resistor; and first output means coupled to the emitter of said eleventh transistor for providing a first output voltage as a function of said first, second, third and fourth select signals.

2. The circuit of claim 1 wherein the DC characteristics of said second and third transistors are substantially matched so that in steady state the current through said second transistor substantially equals the current through said third transistor.

3. The circuit of claim 2 wherein the AC characteristics of said second and third transistors are substantially matched so that in steady state and during transitions the current through said second transistor substantially equals the current through said third transistor.

4. The circuit of claim 1 further comprising:
twelfth transistor means including a twelfth transistor with its collector coupled to the collector of said fifth transistor and its emitter coupled to the emitter of said fith transistor;

thirteenth transistor means including a thirteenth transistor with its collector coupled to the collector of seventh transistor and its emitter coupled to the emitter of said seventh transistor; and fifth gating means coupled for turning on said twelfth transistor while turning off said thirteenth transistor and for turning on said thirteenth transistor while turning off said twelfth transistor, said fifth gating means being coupled to recieve a fifth binary signal and to apply it to the base of said twelfth transistor and to apply thecomplement of said fifth select signal to said thirteenth transistor.

5. The circuit of claim 4 wherein said first output means includes a fourteenth transistor means with a fourteenth transistor with its collector coupled to said high source voltage means, its base coupled to the emitter of said eleventh transistor, and its collector coupling said first output voltage to the base of said ninth transistor so as to define said fourth binary signal.

6. The circuit of claim 5 wherein said first gating means includes a fifteenth transistor means including a fifteenth transistor with its emitter coupled to the bsae of said fourth transistor, its collector coupled to said high source voltage means, and its base being coupled to receive a sixth binary signal for determining the voltage level of said first binary signal.

7. The circuit of claim 6 wherein the DC characteristics of said second and third transistors are substantially matched so that in steady state the current through said second transistor substantially equals the current through said third transistor.

8. The circuit of claim 7 wherein the AC characteristics of said second and third transistors are substantially matched so that in steady state and during transitions the current through said second transistor substantially equals the current through said third transistor.

9. The circuit of claim 6 further comprising:
sixteenth transistor means including a sixteenth transistor, said sixteenth transistor having its emitter coupled to said low source voltage means, said sixteenth transistor means including means for supplying a voltage to the base of said sixteenth transistor so as to maintain a substantially constant current therethrough;
seventeenth transistor means including a seventeenth transistor with its emitter coupled to the collector of said sixteenth transistor and its base coupled to the emitter of said fifteenth transistor;
eighteenth transistor means including an eighteenth transistor with its emitter coupled to the collector of said sixteenth transistor and its base coupled to said low reference source voltage;
nineteenth transistor means including a nineteenth transistor with its emitter coupled to the collector of said seventeenth transistor and its base coupled to be emitter of said fourteenth transistor so as to receive said first output voltage;
twentieth transistor means including a twentieth transistor with its emitter coupled to the collector of said seventeenth transistor and its base coupled to said high reference voltage;
twenty-first transistor means including a twenty-first transistor with its emitter coupled to the collector of said eighteenth transistor, its base coupled to said high reference voltage means, and its collector being coupled to the collector of said twentieth transistor;
twenty-second transistor means including a twenty second transistor with its emitter coupled to the collector of aid eighteenth transistor, and with its collector coupled to the collector of said nineteenth transistor;
load resistor means including a second load resistor coupled between said high source voltage means and the collector of one of said nineteenth and twentieth transistors and inclduing a third load resistor coupled between said high source voltage means and the collector of the other of said nineteenth and twentieth transistors;
twenty-third transistor means inluding a twenty-third transistor having its collector coupled to said high source voltage means, its emitter coupled to the base of said twenty-second transistor and its base coupled to the collector of said twenty-first transistor; and
second output voltage means for providing a second output voltage as a function of the voltage at the collector of said twentieth transistor.

10. The circuit of claim 9 wherein said second output means includes a twenty-fourth transistor with its collector coupled to said high source voltage means and its base coupled to the collector of said twentieth transistor, the voltage at the emitter of said twenty-fourth transistor defining said second output voltage.

11. The circuit of claim 10 wherein said second output means further includes a twenty-fifth transistor with its collector coupled to said high source voltage means and its base coupled to the collector of said nineteenth transistor so that the voltage at the emitter of said twenty-fifth transistor defines the complement said second output voltage.

12. The circuit of claim 11 wherein the emitters of said first, fourteenth, fifteenth, sixteenth, twenty-third, twenty-fourth and twenty-fifth are coupled to said low source voltage means via resistors, wherein the emitters of said second and third transistors are coupled vias a resistor to the collector of said first transistor and the emitter of said fourth transistor, and wherein the emitter of said seventeeth transistor is coupled via a resistor to the collector of said sixteenth transistor and the emitter of said eighteenth transistor.

13. The circuit of claim 12 wherein the DC characteristics of said second and third transistors are substantially matched so that in steady state the current through said second transistor substantially equals the current through said third transistor.

14. The circuit of claim 13 wherein the AC characteristics of said second and third transistors are substantially matched so that in steady state and during transitions the current through said second transistor substantially equals the current through said third transistor.

* * * * *